(12) United States Patent
Kimura et al.

(10) Patent No.: US 8,822,351 B2
(45) Date of Patent: Sep. 2, 2014

(54) COMPOSITION FOR THERMOSETTING SILCONE RESIN

(75) Inventors: Ryuichi Kimura, Osaka (JP); Hiroyuki Katayama, Osaka (JP)

(73) Assignee: Nitto Denko Corporation, Osaka (JP)

( * ) Notice: Subject to any disclaimer, the term of this patent is extended or adjusted under 35 U.S.C. 154(b) by 290 days.

(21) Appl. No.: 13/037,510

(22) Filed: Mar. 1, 2011

(65) Prior Publication Data

US 2011/0210371 A1     Sep. 1, 2011

(30) Foreign Application Priority Data

Mar. 1, 2010    (JP) ................................. 2010-044277

(51) Int. Cl.

| | | |
|---|---|---|
| *H01L 21/3105* | (2006.01) | |
| *H01L 21/312* | (2006.01) | |
| *C08G 77/20* | (2006.01) | |
| *C08L 83/04* | (2006.01) | |
| *C08G 77/16* | (2006.01) | |
| *C08K 5/5419* | (2006.01) | |
| *H01L 33/56* | (2010.01) | |
| *C08K 5/56* | (2006.01) | |
| *C08G 77/12* | (2006.01) | |
| *C08K 5/57* | (2006.01) | |

(52) U.S. Cl.
CPC ................. *C08L 83/04* (2013.01); *C08G 77/16* (2013.01); *C08G 77/20* (2013.01); *C08K 5/5419* (2013.01); *H01L 33/56* (2013.01); *C08K 5/56* (2013.01); *C08G 77/12* (2013.01); *C08K 5/57* (2013.01)
USPC ......................................................... 438/781

(58) Field of Classification Search
USPC .................................................. 438/780, 781
See application file for complete search history.

(56) References Cited

U.S. PATENT DOCUMENTS

| | | | |
|---|---|---|---|
| 3,518,325 A | 6/1970 | Campbell et al. | |
| 4,558,109 A | 12/1985 | McAfee | |
| 5,610,230 A | 3/1997 | Yoshida et al. | |
| 5,623,030 A | 4/1997 | Tsumura et al. | |
| 5,696,209 A | 12/1997 | King et al. | |
| 6,693,142 B1 * | 2/2004 | Wakiya et al. | ................ 522/155 |
| 2004/0092619 A1 | 5/2004 | Wakiya et al. | |
| 2004/0116640 A1 | 6/2004 | Miyoshi | |
| 2010/0148378 A1 * | 6/2010 | Katayama et al. | ............ 257/791 |
| 2010/0168313 A1 | 7/2010 | Mizuno et al. | |
| 2010/0173069 A1 | 7/2010 | Lu et al. | |
| 2011/0160409 A1 * | 6/2011 | Yamamoto | ................... 525/477 |
| 2011/0269918 A1 * | 11/2011 | Hamamoto et al. | ......... 525/478 |

FOREIGN PATENT DOCUMENTS

| | | |
|---|---|---|
| CN | 1346374 A | 4/2002 |
| CN | 101558129 A | 10/2009 |
| EP | 2 196 503 A1 | 6/2010 |
| EP | 2 338 937 A1 | 6/2011 |
| JP | 61-83251 A | 4/1986 |
| JP | 06-118254 A | 4/1994 |
| JP | 9-155880 A | 6/1997 |
| JP | 10-121024 A | 5/1998 |
| JP | 2000-198930 A | 7/2000 |
| JP | 2004-186168 A | 7/2004 |
| JP | 2008-150437 A | 7/2008 |
| JP | 2010-43136 A | 2/2010 |
| JP | 2010-265436 A | 11/2010 |
| WO | 2009/042227 A2 | 4/2009 |

OTHER PUBLICATIONS

Extended European Search Report dated Oct. 15, 2013, issued by the European Patent Office in corresponding European Application No. 11156117.1.
Notification of Reasons for Refusal dated Dec. 25, 2013 issued by the Japanese Patent Office in counterpart Japanese Patent Application No. 2010-044277.
Office Action dated Mar. 4, 2014 issued by the State Intellectual Property Office of the People's Republic of China in counterpart Chinese Patent Application No. 201110051555.5.

* cited by examiner

*Primary Examiner* — Zandra Smith
*Assistant Examiner* — Toniae Thomas
(74) *Attorney, Agent, or Firm* — Sughrue Mion, PLLC

(57) ABSTRACT

The present invention relates to a composition for a thermosetting silicone resin including: a dual-end silanol type silicone oil; an alkenyl-containing silicon compound; an organohydrogensiloxane; a condensation catalyst; and a hydrosilylation catalyst, in which the condensation catalyst includes a tin complex compound.

7 Claims, No Drawings

COMPOSITION FOR THERMOSETTING SILCONE RESIN

FIELD OF THE INVENTION

The present invention relates to a composition for a thermosetting silicone resin. More particularly, the invention relates to a composition for a thermosetting silicone resin that is capable of forming a semi-cured state in which the composition can be used for encapsulating an optical-semiconductor element. The invention further relates to a silicone resin sheet which is a semi-cured sheet obtained from the composition, a cured resin obtained by further curing the sheet, and an optical-semiconductor device including an optical-semiconductor element encapsulated with the sheet.

BACKGROUND OF THE INVENTION

Encapsulating materials having excellent light resistance and heat resistance are desired for high-power white LED devices whose application to generic illumination is being studied. In recent years, the so-called "addition curing type silicones" are frequently used.

The addition curing type silicones are obtained by thermally curing, in the presence of a platinum catalyst, a mixture including as main components a silicone derivative having a vinyl group in the main chain thereof and a silicone derivative having an SiH group in the main chain thereof. For example, patent document 1 discloses a resin composition into which an organopolysiloxane has been incorporated to regulate the molar ratio of silicon-bonded hydrogen atoms to alkenyl groups in the composition to a value within a specific range and from which a cured product having excellent transparency and insulating properties is therefore obtained.

Patent document 2 discloses a resin composition containing a silicone resin having at least two silicon-bonded alkenyl groups per molecule and an organohydrogensilane and/or organohydrogenpolysiloxane which has at least two silicon-bonded hydrogen atoms per molecule.

Patent document 3 discloses a composition that includes a combination of specific amounts of silicone resin ingredients having an SiH group, the silicone resin ingredients being a polyorganohydrogensiloxane which is linear and has a silicon-bonded hydrogen atom (Si—H group) somewhere in the molecular chain and a polyorganohydrogensiloxane which is linear and has an Si—H group at each of both ends of the molecular chain, and that hence gives a cured product having excellent strength.

On the other hand, for the addition curing type silicone resins, a highly active platinum catalyst is usually used. Because of this, once the curing reaction initiates, it is extremely difficult to stop the reaction in the course thereof. It is hence difficult to obtain a semi-cured state (stage B). It is known that addition of a phosphorus, nitrogen, or sulfur compound or an acetylene compound as a reaction inhibitor is effective in reducing the catalytic activity of the platinum catalyst (see, for example, patent document 4).
Patent Document 1: JP-A-2000-198930
Patent Document 2: JP-A-2004-186168
Patent Document 3: JP-A-2008-150437
Patent Document 4: JP-A-6-118254

SUMMARY OF THE INVENTION

Although the conventional addition curing type silicones attain excellent durability, these silicones have drawbacks, for example, that handling thereof is troublesome because the silicones are viscous liquids before being subjected to a curing reaction, and that there are cases where the silicones change in viscosity, depending on the surrounding environment. The conventional addition curing type silicone resins are still unsatisfactory.

Furthermore, since the compounds known as reaction inhibitors affect the durability of the resin, there is a desire for another method for reaction control.

The present inventors hence made investigations. As a result, the inventors found that a composition including a dual-end silanol type silicone oil, an alkenyl-containing silicon compound, an organohydrogensiloxane, a condensation catalyst, and a hydrosilylation catalyst can first undergo a condensation reaction between the dual-end silanol type silicone oil and the alkenyl-containing silicon compound to forming a semi-cured state, and subsequently undergo an addition reaction between the alkenyl-containing silicon compound and the organohydrogensiloxane to forming a completely cured state. However, it was found that in the composition having the above-described constitution, the organohydrogensiloxane hydrolyzes to induce a condensation reaction (side reaction), besides undergoing the addition reaction (main reaction) with the alkenyl-containing silicon compound. This hydrolysis generates hydrogen gas, and the resultant hydrolyzate undergoes a condensation reaction to increase the viscosity of the composition. It has hence become necessary to inhibit such side reactions.

An object of the invention is to provide a composition for thermosetting silicone resin in which the generation of hydrogen gas, which is a flammable gas, is inhibited and viscosity increase and gelation can be inhibited, and which is capable of forming a semi-cured state in which the composition can be used for encapsulating optical-semiconductor elements. Another object is to provide a silicone resin sheet which is a semi-cured sheet obtained from the composition, a cured resin obtained by further curing the sheet, and an optical-semiconductor device including an optical-semiconductor element encapsulated with the sheet.

The present inventors made investigations in order to overcome the problems. As a result, the inventors have found that organohydrogensiloxanes hydrolyze under alkaline conditions and hence that the organohydrogensiloxanes can be inhibited from undergoing hydrolysis/condensation reactions by using a Lewis-acidic tin complex compound as a condensation catalyst. The invention has been thus completed.

Namely, the present invention relates to the following items 1 to 8.

1. A composition for a thermosetting silicone resin including:
    (1) a dual-end silanol type silicone oil;
    (2) an alkenyl-containing silicon compound;
    (3) an organohydrogensiloxane;
    (4) a condensation catalyst; and
    (5) a hydrosilylation catalyst, in which the (4) condensation catalyst comprises a tin complex compound.
2. The composition according to item 1, in which the (1) dual-end silanol type silicone oil is a compound represented by formula (I):

in which $R^1$ represents a monovalent hydrocarbon group, and n is an integer of 1 or larger, provided that all $R^1$ groups may be the same or different.

3. The composition according to item 1 or 2, in which the (2) alkenyl-containing silicon compound is a compound represented by formula (II):

$$R^2-SiX_3 \qquad (II)$$

in which $R^2$ represents an organic group having a framework containing an alkenyl group, and X represents a halogen atom, an alkoxy group, or an acetoxy group, provided that the three Xs may be the same or different.

4. The composition according to any one of items 1 to 3, in which the (3) organohydrogensiloxane comprises at least one kind selected from the group consisting of compounds represented by formula (III):

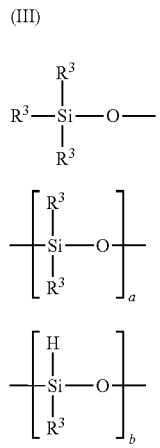

in which A, B, and C indicate constitutional units, A representing an end unit and B and C representing repeating units, $R^3$ represents a monovalent hydrocarbon group, a is an integer of 0 or larger, and b is an integer of 2 or larger, provided that all $R^3$ groups may be the same or different, and compounds represented by formula (IV):

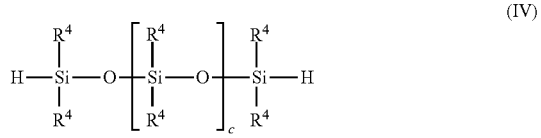

in which $R^4$ represents a monovalent hydrocarbon group, and c represents an integer of 0 or larger, provided that all $R^4$ groups may be the same or different.

5. The composition according to any one of items 1 to 4, in which the (4) condensation catalyst includes di-n-butyldiacetoxytin or bis(2-ethylhexanoate)tin as the tin complex compound.

6. A silicone resin sheet obtained by semi-curing the composition according to any one of items 1 to 5.

7. A silicone resin cured product obtained by curing the silicone resin sheet according to item 6.

8. An optical-semiconductor device obtained by encapsulating an optical-semiconductor element using the silicone resin sheet according to item 6.

The composition for thermosetting silicone resin of the invention is inhibited from increasing in viscosity or gelling and is inhibited from generating hydrogen gas, which is a flammable gas. The composition can hence be produced without requiring the use of a special apparatus. Consequently, simplification of production steps and a reduction in production cost are expected.

DETAILED DESCRIPTION OF THE INVENTION

The composition for thermosetting silicone resin of the invention includes the following ingredients: (1) a dual-end silanol type silicone oil; (2) an alkenyl-containing silicon compound; (3) an organohydrogensiloxane; (4) a condensation catalyst; and (5) a hydrosilylation catalyst. A great feature of this composition resides in that the condensation catalyst includes a tin complex compound.

The semi-cured state (hereinafter referred to also as stage B) of a general epoxy resin or the like is attained usually by controlling thermal-curing conditions. Specifically, stage-B pellets are prepared by heating the resin at, for example, 80° C. to allow the monomer-crosslinking reaction to proceed partially. The pellets obtained are subjected to desired molding and then heated at 150° C. to completely cure the resin. On the other hand, an addition curing type thermosetting silicone resin is obtained by subjecting a silicone derivative having a vinyl group in the main chain to an addition reaction (hydrosilylation reaction) with a silicone derivative having an SiH group in the main chain, and a highly active platinum catalyst is usually used for the resin. Because of this, once the curing reaction of this thermosetting silicone resin initiates, it is extremely difficult to stop the reaction in the course thereof. It is hence difficult to obtain stage B. Furthermore, although the technique of controlling the reaction by a reaction inhibitor is known, the control with a reaction inhibitor is not easy because the progress of the reaction varies depending on the kind of reaction inhibitor and the use amount thereof.

The composition of the invention contains a compound capable of reacting with both a monomer which takes part in a condensation reaction and a monomer which takes part in a hydrosilylation reaction, so that monomer-crosslinking reactions are conducted in two reaction systems differing in reaction temperature, i.e., a condensation reaction system and an addition reaction (hydrosilylation reaction) system. This composition hence is reacted at a regulated temperature to control the crosslinking reactions, thereby preparing stage-B pellets. Namely, the dual-end silanol type silicone oil is first made to undergo a condensation reaction with the alkenyl-containing silicon compound to prepare a resin in a semi-cured state, and the organohydrogensiloxane is subsequently made to undergo an addition reaction with the resin. It is presumed that a completely cured resin can be thus prepared. Consequently, so long as the hydrosilylation reaction is prevented from occurring, the semi-cured state can be maintained and stable storage in stage B is ensured. Furthermore, the composition of the invention attains excellent heat resistance and light resistance because a silicone is used as a monomer for resin. Meanwhile, it was found that alkaline condensation catalysts accelerate the hydrolysis of the organohydrogensiloxane and the resultant hydrolyzate undergoes a condensation reaction to increase the viscosity of the composition. Consequently, a tin complex catalyst which is not alkaline is used as a condensation catalyst in the invention. As a result, the organohydrogensiloxane is inhibited from hydrolyzing, and the composition is inhibited from being increased in viscosity by the condensation reaction of a hydrolyzate. In addition, the generation of hydrogen gas during hydrolysis can also be inhibited. It is thought that a composition for silicone resin which has moderate viscosity that renders the composition satisfactorily handleable can hence be safely prepared and that a resin composition having excellent heat resistance and light resistance can be obtained from that composition. Incidentally, in this specification, a semi-cured product, i.e., a product in a semi-cured state (stage B), means an product that is in a state intermediate between stage A, in which the composition is soluble in solvents, and stage C, in which the composition has been completely cured, and that has somewhat undergone curing or gelation. Namely, the semi-cured product is in such a state that the product swells in solvents but does not completely dissolve therein, and that the product is softened but is not melted by heating. A completely cured product means a product that is in a state where curing or gelation has completely proceeded.

The composition for thermosetting silicone resin of the invention includes:
(1) a dual-end silanol type silicone oil;
(2) an alkenyl-containing silicon compound;
(3) an organohydrogensiloxane;
(4) a condensation catalyst; and
(5) a hydrosilylation catalyst.

(1) Dual-End Silanol Type Silicone Oil

The dual-end silanol type silicone oil in the invention is not particularly limited. However, from the standpoint of compatibility with the other components, it is preferred that the silicone oil should be a compound represented by formula (I):

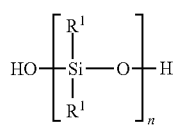
(I)

in which $R^1$ represents a monovalent hydrocarbon group, and n is an integer of 1 or larger, provided that all $R^1$ groups may be the same or different. Incidentally, in the invention, since the end silanol groups of the dual-end silanol type silicone oil undergo a condensation reaction, the dual-end silanol type silicone oil is referred to as a condensation-reaction monomer.

$R^1$ in formula (I) represents a monovalent hydrocarbon group, and examples thereof include saturated or unsaturated hydrocarbon groups which are linear, branched, or cyclic. The number of carbon atoms of the hydrocarbon group is preferably 1 to 20, more preferably 1 to 10, from the standpoints of ease of preparation and thermal stability. Specific examples thereof include methyl, ethyl, propyl, butyl, pentyl, hexyl, phenyl, naphthyl, cyclohexyl, and cyclopentyl. Of these, methyl is preferred from the standpoints of transparency and light resistance. In formula (I), although all $R^1$ groups may be the same or different, it is preferred that all should be methyl.

Although n in formula (I) represents an integer of 1 or larger, n is an integer of preferably 1 to 10,000, more preferably 1 to 1,000, from the standpoints of stability and handling property.

Examples of the compound represented by formula (I) include dual-end silanol type polydimethylsiloxanes, dual-end silanol type polymethylphenylsiloxanes, and dual-end silanol type polydiphenylsiloxanes. These compounds may be used either alone or in combination of two or more thereof. Preferred of these are compounds in which all $R^1$ groups are methyl and n is an integer of 1 to 1,000.

The compound represented by formula (I) may he a commercial product, or may be a product synthesized by a known method.

It is desirable, from the standpoints of stability and handling property, that the molecular weight of the compound represented by formula (I) should be preferably 100 to 1,000,000, more preferably 100 to 100,000. Incidentally, in this specification, the molecular weights of silicone derivatives are determined by gel permeation chromatography (GPC).

In the dual-end silanol type silicone oil, the content of the compound represented by formula (I) is preferably 50% by weight or more, more preferably 80% by weight or more, even more preferably substantially 100% by weight.

The content of the dual-end silanol type silicone oil in the composition is preferably 1 to 99% by weight, more preferably 50-99% by weight, even more preferably 80-99% by weight.

(2) Alkenyl-Containing Silicon Compound

The alkenyl-containing silicon compound in the invention is not particularly limited. However, from the standpoint of compatibility with the other components, it is preferred that the silicon compound should be a compound represented by formula (II):

in which $R^2$ represents an organic group having a framework containing an alkenyl group, and X represents a halogen atom, an alkoxy group, or an acetoxy group, provided that the three Xs may be same or different. Incidentally, in the invention, the alkenyl group of the alkenyl-containing silicon compound undergoes a hydrosilylation reaction, and a functional group other than the alkenyl group undergoes a condensation reaction to form a resin. Consequently, the alkenyl-containing silicon compound is a compound which reacts with both the component that takes part in a condensation reaction and the component that takes in a hydrosilylation reaction. When the composition of the invention is cured, the monomer that takes part in a condensation reaction and the monomer that takes part in a hydrosilylation reaction combine with each other through the alkenyl-containing silicon compound.

$R^2$ in formula (II) is an organic group having a framework containing an alkenyl group. The number of carbon atoms of the organic group is preferably 1 to 20, more preferably 1 to 10, from the standpoints of ease of preparation and thermal stability. Examples thereof include vinyl, allyl, propenyl, butenyl, pentenyl, hexenyl, heptenyl, octenyl, norbornenyl, and cyclohexenyl. Of these, vinyl is preferred from the standpoint of reactivity in the hydrosilylation reaction.

X in formula (II) represents a halogen atom, an alkoxy group, or an acetoxy group. Examples of the halogen atom include chlorine, bromine, and iodine. The number of carbon atoms of the alkyl group constituting the alkoxy group is preferably 1 to 10, more preferably 1 to 6, from the standpoints of availability and profitability. Specific examples of the alkyl group include methyl, ethyl, propyl, butyl, pentyl, and hexyl. Of these, methyl is preferred from the standpoint of reactivity in the condensation reaction. In formula (II), although all Xs may be the same or different, it is preferred that all should be methoxy.

Examples of the compound represented by formula (II) include vinyltrimethoxysilane, vinyltriethoxysilane, allyltrimethoxysilane, propenyltrimethoxysilane, norbornenyltrimethoxysilane, and octenyltrimethoxysilane. These compounds can be used either alone or in combination of two or more thereof. Preferred of those is vinyltrimethoxysilane, in which $R^2$ is vinyl and all Xs are methoxy.

The compound represented by formula (II) may he a commercial product, or may be a product synthesized by a known method.

In the alkenyl-containing silicon compound, the content of the compound represented by formula (II) is preferably 50% by weight or more, more preferably 80% by weight or more, even more preferably substantially 100% by weight.

The content of the alkenyl-containing silicon compound in the composition is preferably 0.01 to 90% by weight, more preferably 0.01 to 50% by weight, even more preferably 0.01 to 10% by weight.

With respect to the weight ratio of the dual-end silanol type silicone oil to the alkenyl-containing silicon compound, the molar ratio between the functional groups (SiOH/SiX) is preferably from 20/1 to 0.2/1, more preferably from 10/1 to 0.5/1, even more preferably substantially equivalent (1/1), from the standpoint of allowing the SiOH groups of the dual-end silanol type silicone oil and the SiX groups of the alkenyl-containing silicon compound to react with each other in just proportion. When the molar ratio is 20/1 or less, a semi-cured product having moderate toughness is obtained when the composition of the invention is semi-cured. When the molar ratio is 0.2/1 or more, the proportion of the alkenyl-containing silicon compound is not too large, and the resultant resin has satisfactory heat resistance.

(3) Organohydrogensiloxane

The organohydrogensiloxane in the invention is not particularly limited. However, from the standpoint of compatibility with the other components, it is preferred that the organohydrogensiloxane should be at least one member selected from the group consisting of compounds represented by formula (III):

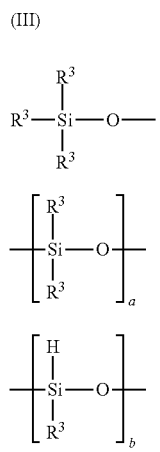

in which A, B, and C indicate constitutional units, A representing an end unit and B and C representing repeating units, $R^3$ represents a monovalent hydrocarbon group, a is an integer of 0 or larger, and b is an integer of 2 or larger, provided that all $R^3$ groups may be the same or different, and compounds represented by formula (IV):

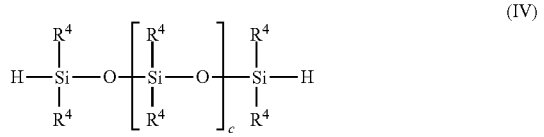

in which $R^4$ represents a monovalent hydrocarbon group and c represents an integer of 0 or larger, provided that all $R^4$ groups may be the same or different. Incidentally, in the invention, since the SiH groups of the organohydrogensiloxane undergo a hydrosilylation reaction, the organohydrogensiloxane is referred to as a monomer taking part in a hydrosilylation reaction. In this specification, the "organohydrogensiloxane" is a general term for all compounds ranging from low-molecular to high-molecular compounds, such as organohydrogendisiloxanes to organohydrogenpolysiloxanes.

The compounds represented by formula (III) are compounds which are constituted of constitutional units A, B, and C, in which A is an end unit and B and C are repeating units, and in which hydrogen atoms are contained in the repeating units.

The $R^3$ groups in formula (III), i.e., the $R^3$s in constitutional unit A, the $R^3$s in constitutional unit B, and the $R^3$ in constitutional unit C, each represent a monovalent hydrocarbon group, and examples thereof include saturated or unsaturated hydrocarbon groups which are linear, branched, or cyclic. The number of carbon atoms of the hydrocarbon group is preferably 1 to 20, more preferably 1 to 10, from the standpoints of ease of preparation and thermal stability. Examples thereof include methyl, ethyl, propyl, butyl, pentyl, hexyl, phenyl, naphthyl, cyclohexyl, and cyclopentyl. Of these, methyl and ethyl are preferred from the standpoints of transparency and light resistance. In formula (III), all $R^3$ groups may be the same or different, and each independently represent any of those hydrocarbon groups regardless of the constitutional units.

Constitutional unit A is an end unit, and two constitutional units A are contained in formula (III).

The number of repeating units which each are constitutional unit B. i.e., "a" in formula (III), is an integer of 0 or larger. However, "a" is an integer of preferably 1 to 1,000, more preferably 1 to 100, from the standpoint of reactivity.

The number of repeating units which each are constitutional unit C, i.e., "b" in formula (III), is an integer of 2 or larger. However, "b" is an integer of preferably 2 to 10,000, more preferably 2 to 1,000, from the standpoint of reactivity.

Examples of the compounds represented by formula (III) include methylhydrogenpolysiloxanes, dimethylpolysiloxane-co-methylhydrogenpolysiloxanes, ethylhydrogenpolysiloxanes, and methylhydrogenpolysiloxane-co-methylphenylpolysiloxanes. These compounds may he used either alone or in combination of two or more thereof. Preferred of these are compounds in which $R^4$ is methyl, a is 0, and b is an integer of 2 or larger and compounds in which $R^4$ ethyl, a is 0, and b is an integer of 2 or larger.

It is desirable that the compounds represented by formula (III) should have a molecular weight of preferably 100 to 1,000,000, more preferably 100 to 100,000, from the standpoints of stability and handling property.

The compounds represented by formula (IV) are compounds having hydrogen atoms at the ends.

$R^4$ in formula (IV) represents a monovalent hydrocarbon group, and examples thereof include saturated or unsaturated hydrocarbon groups which are linear, branched, or cyclic. The number of carbon atoms of the hydrocarbon group is preferably 1 to 20, more preferably 1 to 10, from the standpoints of ease of preparation and thermal stability. Examples thereof include methyl, ethyl, propyl, butyl, pentyl, hexyl, phenyl, naphthyl, cyclohexyl, and cyclopentyl. Of these, methyl and ethyl are preferred from the standpoints of transparency and light resistance. In formula (IV), although all $R^4$ groups may be the same or different, it is preferred that all should be methyl or ethyl.

"c" in formula (IV) represents an integer of 0 or larger. However, "c" is an integer of preferably 1 to 10,000, more preferably 1 to 1,000, from the standpoint of reactivity.

Examples of the compounds represented by formula (IV) include dual-end hydrosilyl type polydimethylsiloxanes, dual-end hydrosilyl type polymethylphenylsiloxanes and dual-end hydrosilyl type polydiphenylsiloxanes. These compounds can be used either alone or in combination of two or more thereof. Preferred of these are compounds in which all $R^4$ groups are methyl and c is an integer of 1 to 1,000 and compounds in which all $R^4$ groups are ethyl and c is an integer of 1 to 1,000.

It is desirable that the compounds represented by formula (IV) should have a molecular weight of preferably 100 to 1,000,000, more preferably 100 to 100,000, from the standpoints of stability and handling property.

As the compounds represented by formula (III) and formula (IV), use may be made of commercial products or products synthesized by known methods.

In the organohydrogensiloxane, the total content of the compounds represented by formula (III) and formula (IV) is preferably 50% by weight or more, more preferably 80% by weight or more, even more preferably substantially 100% by weight.

The content of the organohydrogensiloxane in the composition is preferably 0.1 to 99% by weight, more preferably 0.1 to 90% by weight, even more preferably 0.1 to 80% by weight.

With respect to the weight ratio of the alkenyl-containing silicon compound to the organohydrogensiloxane, the molar ratio between the functional groups ($SiR^2$/SiH) is desirably from 20/1 to 0.05/1, preferably from 20/1 to 0.1/1, more preferably from 10/1 to 0.1/1, even more preferably from 10/1 to 0.2/1, especially preferably from 5/1 to 0.2/1, and in particular, substantially equivalent (1/1), from the standpoint of allowing the $SiR^2$ group of the alkenyl-containing silicon compound and the SiH groups of the organohydrogensiloxane to react with each other in just proportion. When the molar ratio is 20/1 or less, the composition of the invention comes to have moderate toughness when semi-cured. When the molar ratio is 0.1/1 or more, the proportion of the organohydrogensiloxane is not too large, and the resultant resin has satisfactory heat resistance and toughness. Furthermore, the composition in which the molar ratio is less than 1/1 but is 0.05/1 or more can be cured into a semi-cured state at a higher rate in a shorter time period than the composition in which the molar ratio is from 20/1 to 1/1.

The weight ratio of the monomer taking part in a condensation reaction to the monomer taking part in a hydrosilylation reaction, i.e., the weight ratio of the dual-end silanol type silicone oil to the organohydrogensiloxane (dual-end silanol type silicone oil/organohydrogensiloxane), is preferably from 99.9/0.1 to 1/99, more preferably from 99.9/0.1 to 50/50, even more preferably from 99.9/0.1 to 90/10, from the standpoint of the viscoelasticity of the sheet to be formed.

(4) Condensation Catalyst

The condensation catalyst in the invention includes a tin complex compound which catalyzes the condensation reaction between a silanol group and an alkoxysilyl group. Suitable for use as the tin complex compound is a commercial product such as di-n-butyldiacetoxytin, bis(2-ethylhexanoate)tin, bis(neodecanoate)tin, dibutylbis(2-ethylhexylmaleate)tin, dibutyldilauryltin, dimethyldineodecanoatetin, dibutylbis(2,4-pentanedionate)tin, dioctyldilauryltin, tin oleate, or the like. Of these, di-n-butyldiacetoxytin and bis(2-ethylhexanoate)tin are more preferable as the tin complex compound. Since the tin complex compound is Lewis-acidic, this compound does not accelerate the hydrolysis of the organohydrogensiloxane.

The composition of the invention may contain a condensation catalyst other than the tin complex compound so long as the incorporation thereof does not lessen the effects of the invention. Examples of the other condensation catalyst include acids such as hydrochloric acid, acetic acid, formic acid, and sulfuric acid; bases such as potassium hydroxide, sodium hydroxide, and potassium carbonate; and metal-based catalysts such as aluminum, titanium, and zinc. The content of the tin complex compound in the condensation catalyst is preferably 20% by weight or more, more preferably 50% by weight or more, even more preferably substantially 100% by weight.

The content of the condensation catalyst in the composition is preferably 0.1 to 50 mol, more preferably 1.0 to 5 mol, per 100 mol of the dual-end silanol type silicone oil. When the content thereof is less than 0.1 mol per 100 mol of the dual-end silanol type silicone oil, the reaction proceeds slowly. On the other hand, when the content thereof exceeds 5 mol per 100 mol of the dual-end silanol type silicone oil, the resultant resin after thermally curing is apt to be colored, whereby the optical characteristics thereof, especially in the use of LED, is deteriorated.

(5) Hydrosilylation Catalyst

The hydrosilylation catalyst in the invention is not particularly limited so long as the catalyst is a compound which catalyzes the hydrosilylation reaction of a hydrosilane compound with an alkene. Examples thereof include platinum catalysts such as platinum black, platinum chloride, chloroplatinic acid, platinum/olefin complexes, platinum/carbonyl complexes, and platinum/acetylacetate; and palladium catalysts and rhodium catalysts. Of these, platinum/carbonyl complexes are preferred from the standpoints of compatibility, transparency, and catalytic activity.

The content of the hydrosilylation catalyst in the composition is as follows. In the case of using a platinum catalyst, for example, the content thereof in terms of platinum amount is desirably $1.0 \times 10^{-1}$ to 1 part by weight, preferably $1.0 \times 10^{-1}$ to 0.5 parts by weight, more preferably $1.0 \times 10^{-3}$ to 0.05 parts by weight, per 100 parts by weight of the organohydrogensiloxane.

The composition for thermosetting silicone resin of the invention may contain additives such as an antioxidant, modifier, surfactant, dye, pigment, discoloration inhibitor, and ultraviolet absorber, besides the ingredients described above, so long as the incorporation of such additives does not impair the effects of the invention.

The composition for thermosetting silicone resin of the invention can be prepared without particular limitations so long as the composition includes the following ingredients: (1) a dual-end silanol type silicone oil, (2) an alkenyl-containing silicon compound, (3) an organohydrogensiloxane, (4) a condensation catalyst, and (5) a hydrosilylation catalyst. However, since reactions in the composition of the invention are made to proceed and are completed using reaction temperatures and reaction times suitably selected according to the reaction mechanisms of the condensation reaction and hydrosilylation reaction, use may be made of a method in which the ingredients that take part in the condensation reaction are mixed together beforehand and the ingredients that take part in the hydrosilylation reaction are mixed thereafter.

The mixing of the ingredients that take part in the condensation reaction can be accomplished by stirring the dual-end silanol type silicone oil (1), the alkenyl-containing silicon compound (2), and the condensation catalyst (4) preferably at 0 to 60° C. for a period of from 5 minutes to 24 hours. Although the alkenyl-containing silicon compound is an ingredient which takes part in both the condensation reaction and the hydrosilylation reaction, it is preferred to mix this ingredient simultaneously with the dual-end silanol type silicone oil (1) because the condensation reaction is initiated at a lower temperature than the hydrosilylation reaction.

Incidentally, the condensation reaction between the SiOH groups of the dual-end silanol type silicone oil and the SiX groups of the alkenyl-containing silicon compound may be partly initiated as a result of the mixing. The degree of progress of the condensation reaction can he ascertained through $^1$H-NMR analysis on the basis of the degree of disappearance of the peak assigned to the SiX groups of the alkenyl-containing silicon compound or the peak assigned to the SiOH groups of the dual-end silanol type silicone oil.

Subsequently, the organohydrogensiloxane (3) and the hydrosilylation catalyst (5) are mixed, as ingredients which take part in the hydrosilylation reaction, with the mixture of the ingredients which take part in the condensation reaction. When a cured product is to be obtained from the composition of the invention through the two kinds of reactions, i.e., a condensation reaction and a hydrosilylation reaction, a molded product in a semi-cured state can be prepared by conducting the condensation reaction only. Consequently, methods for mixing the ingredients which take part in the hydrosilylation reaction are not particularly limited so long as these ingredients are evenly mixed with the mixture of the ingredients which take part in the condensation reaction.

The composition of the invention thus obtained is inhibited from increasing in viscosity or gelling, because the organohydrogensiloxane is inhibited from hydrolyzing. The viscosity at 25° C. of the composition of the invention is preferably 10 to 100,000 mPa·s, more preferably 1,000 to 20,000 mPa·s. In this specification, viscosity can be measured with a Brookfield viscometer.

Since the composition of the invention contains a silicone derivative having excellent heat resistance and light resistance as a main component, the composition is suitable for use as an encapsulating material for optical-semiconductor elements. The invention therefore provides: an encapsulating material for optical-semiconductor elements which includes the composition of the invention; and an optical-semiconductor device obtained by encapsulating an optical-semiconductor element using the encapsulating material.

The composition for thermosetting silicone resin of the invention can be formed into a sheet, for example, by applying the composition in an appropriate thickness on a release sheet (e.g., a polyethylene substrate), the surface of which has been treated with a release treatment, by a technique such as casting, spin coating, or roll coating, and drying the composition by heating at such a temperature that solvent removal is possible. The heating temperature varies depending on the kind of solvent used, and is not unconditionally determined. However, this heating of the composition of the invention can be conducted so as to complete the condensation reaction in addition to solvent removal, and a silicone resin sheet in a semi-cured state (stage B) can be thereby prepared. Consequently, the invention furthermore provides a silicone resin sheet obtained by semi-curing the composition for thermosetting silicone resin of the invention. In this specification, the term "completion of a reaction" means the case where at least 80% of the functional groups which take part in the reaction have been reacted. In the condensation reaction, the completion thereof can be ascertained by determining the amount of residual alkoxy groups by the $^1$H-NMR analysis described above.

The heating temperature is preferably 40 to 120° C., more preferably 60 to 100° C. The heating period is preferably 0.1 to 60 minutes, more preferably 0.1 to 15 minutes.

Since the silicone resin sheet of the invention is in a semi-cured state, an optical-semiconductor device can be prepared therewith, for example, by placing the resin sheet as it is on an optical-semiconductor element, encapsulating the element in the resin sheet, and then heating the resin sheet at a high temperature to complete cure the resin sheet. This complete curing of the resin sheet is implemented by reacting the ingredients which take part in the hydrosilylation reaction. Consequently, the invention provides, according to still a further aspect, a silicone resin cured product obtained by curing the silicone resin sheet of the invention.

Methods for conducting encapsulation after the sheet has been placed on a substrate are not particularly limited. Examples thereof include a method in which the sheet is heated with a laminator preferably at 100 to 200° C. and 0.01 to 10 MPa, more preferably at 120 to 160° C. and 0.1 to 1 MPa, for 5 to 600 seconds to thereby contact-bond the sheet and encapsulation is then conducted.

The heating temperature in the heating after the encapsulation is preferably higher than 120° C. but 250° C. or lower, and is more preferably 150 to 200° C. The heating period is preferably 0.5 to 24 hours, more preferably 2 to 6 hours.

Incidentally, the degree of progress of the hydrosilylation reaction can be ascertained through IR analysis on the basis of the degree of absorption of the peak assigned to the SiH groups of the organohydrogensiloxane. When the absorption intensity has become below 20% of the initial value (obtained before the curing reaction), the hydrosilylation reaction has been completed and the resin sheet has been completely cured.

EXAMPLES

The invention will be described below with reference to Examples, but the invention should not be construed as being limited to the Examples, etc.

[Molecular Weight of Silicone Derivative]

The molecular weight is determined in terms of polystyrene by gel permeation chromatography (GPC).

[Viscosity of Composition]

The viscosity is measured with a rheometer under the conditions of 25° C. and 1 atm.

[Amount of Hydrogen Generated]

The amount of hydrogen generated is measured with a gas burette. Specifically, the gas burette is connected to a reaction vessel so that hydrogen gas which generates does not leak out. Under room-temperature (25° C.) conditions, an organohydrogensiloxane is added to a reaction system containing a mixture of ingredients which take part in a condensation reaction, and the volume (mL) of hydrogen gas generated is measured. Hydrogen gas generation substantially ends in 30 minutes, and the measuring time is hence set at 1 hour.

Example 1

A hundred grams (8.7 mmol) of a dual-end silanol type silicone oil (the compound represented by formula (I) in which all $R^1$ groups are methyl; average molecular weight, 11,500) and 0.86 g (5.8 mmol) of vinyltrimethoxysilane (the compound represented by formula (II) in which $R^2$ is vinyl and all Xs are methoxy) as an alkenyl-containing silicon compound [the molar ratio of the SiOH groups of the dual-end silanol type silicone oil to the SiX groups of the alkenyl-containing silicon compound (SiOH/SiX)=1/1] were mixed together by stirring. Thereafter, 0.049 mL (0.17 mmol) of di-n-butyldiacetoxytin (manufactured by GELEST Inc.; purity, 95%) (2.0 mol per 100 mol of the dual-end silanol type silicone oil) was added as a condensation catalyst, and this mixture was stirred at 50° C.; for 3 hours. To the resultant oil were added 2.44 g of an organohydrogensiloxane (the compound represented by formula (III) in which all $R^3$ groups are methyl, a=10, and b=10; viscosity, 20 mPa·s) [the molar ratio of the $SiR^2$ group of the alkenyl-containing silicon compound to the SiH groups of the organohydrogensiloxane ($SiR^2$/SiH)=1/3] and 0.025 mL, of a platinum/carbonyl complex (platinum concentration, $5 \times 10^{-4}$%) (the platinum content was 1.1 part by weight per 100 parts by weight of the organohydrogensiloxane) as a hydrosilylation catalyst. Thus, a composition for silicone resin was obtained.

Example 2

A composition for silicone resin was obtained in the same manner as in Example 1, except that the content of the organohydrogensiloxane was changed from 2.44 g to 0.81 g [the molar ratio of the $SiR^2$ group of the alkenyl-containing silicon compound to the SiH groups of the organohydrogensiloxane ($SiR^2$/SiH)=1/1].

Example 3

A composition for silicone resin was obtained in the same manner as in Example 1, except that the content of the di-n-butyldiacetoxytin was changed from 0.049 mL to 0.012 mL (0.5 mol per 100 mol of the dual-end silanol type silicone oil).

Example 4

A composition for silicone resin was obtained in the same manner as in Example 1, except that 0.058 ml, of bis(2-ethylhexanoate)tin (manufactured by GELEST Inc.) was used (2.0 mol per 100 mol of the dual-end silanol type silicone oil) in place of the 0.049 mL of di-n-butyldiacetoxytin.

Comparative Example 1

A composition for silicone resin was obtained in the same manner as in Example 1, except that 0.19 mL (0.17 mmol) of a methanol solution of tetramethylammonium hydroxide (concentration, 10% by weight) was used as a condensation catalyst (2.0 mol per 100 mol of the dual-end silanol type silicone oil) in place of the 0.049 mL of di-n-butyldiacetoxytin.

Preparation of Semi-Cured Product

Each composition obtained above was applied in a thickness of 500 μm to a biaxially stretched polyester film (manufactured by Mitsubishi Polyester Film; 50 μm) and heated at 80° C. for 10 minutes to prepare a sheet-shaped semi-cured product.

Preparation of Completely Cured Product

A completely cured product was prepared by heating the semi-cured product obtained above, at 150° C. for 4 hours.

Production of Optical-Semiconductor Device

The semi-cured sheet obtained was placed over a substrate on which a blue LED had been mounted. In a reduced-pressure atmosphere, the sheet was heated at 160° C. and encapsulation was conducted at a pressure of 0.2 MPa. The resultant device was heated at 150° C. for 1 hour to thereby completely cure the resin.

The semi-cured products, completely cured products, and optical-semiconductor devices obtained were evaluated for properties according to the following Test Examples 1 to 4. The results thereof are shown in Table 1.

Test Example 1

Light Transmittance

The light transmittance (%) of each completely cured product at a wavelength of 450 nm was measured using a spectrophotometer (U-4100, manufactured by Hitachi High-Technologies Corp.).

Test Example 2

Heat Resistance

Each completely cured product was allowed to stand still in a hot air type drying oven of 200° C. for 24 hours, and the weight of the completely cured product was measured thereafter. The residual ratio (%) was calculated on the basis of the weight of the product measured before the storage (before the standing), which was taken as 100(%). The higher the residual ratio, the better the heat resistance.

Test Example 3

Encapsulated State

The state of each optical-semiconductor device was examined with an optical microscope before and after the encapsulation. The case where the optical-semiconductor element had been completely embedded and the bonding wires had neither deformation nor damage is indicated by "A", while the case where the bonding wires had been deformed or damaged is indicated by "B".

Test Example 4

Light Resistance

A current of 300 mA was permitted to flow through each optical-semiconductor device to switch on the LED element, and the luminance immediately after initiation of the test was measured with an instantaneous multi-photometric system (MCPD-3000, Manufactured by Otsuka Electronics Co., Ltd.). Thereafter, the device was allowed to stand, with the LED element being kept on, and after an elapse of 300 hours, the luminance was measured in the same manner. The retention of luminance is calculated using the following equation to evaluate light resistance. The higher the retention of luminance, the better the light resistance.

Retention of luminance (%)=[(luminance after elapse of 300 hours)/(luminance immediately after initiation of the test)]×100

TABLE 1

|  |  |  | Example 1 | Example 2 | Example 3 | Example 4 | Comp. Ex. 1 |
|---|---|---|---|---|---|---|---|
| Composition | Starting materials | (1) Dual-end silanol type silicone oil | compound of formula (I) wherein all $R^1$s are methyl and n = 155 | compound of formula (I) wherein all $R^1$s are methyl and n = 155 | compound of formula (I) wherein all $R^1$s are methyl and n = 155 | compound of formula (I) wherein all $R^1$s are methyl and n = 155 | compound of formula (I) wherein all $R^1$s are methyl and n = 155 |
|  |  | (2) Alkenyl-containing silicon compound | vinyltrimeth-oxysilane | vinyltrimeth-oxysilane | vinyltrimeth-oxysilane | vinyltrimeth-oxysilane | vinyltrimeth-oxysilane |
|  |  | (3) Organo-hydrogensiloxane | compound of formula (III) wherein all $R^3$s are methyl, a = 10, and b = 10 | compound of formula (III) wherein all $R^3$s are methyl, a = 10, and b = 10 | compound of formula (III) wherein all $R^3$s are methyl, a = 10, and b = 10 | compound of formula (III) wherein all $R^3$s are methyl, a = 10, and b = 10 | compound of formula (III) wherein all $R^3$s are methyl, a = 10, and b = 10 |
|  |  | (4) Condensation catalyst | di-n-butyl-diacetoxytin | di-n-butyl-diacetoxytin | di-n-butyl-diacetoxytin | bis(2-ethyl-hexanoate)tin | tetramethyl-ammonium hydroxide |
|  |  | (5) Hydro-silylation catalyst | platinum/carbonyl complex | platinum/carbonyl complex | platinum/carbonyl complex | platinum/carbonyl complex | platinum/carbonyl complex |
|  | Content of (4)[1] |  | 2.0 | 2.0 | 0.5 | 2.0 | 2.0 |
|  | SiOH/SiX[2] |  | 1/1 | 1/1 | 1/1 | 1/1 | 1/1 |
|  | Silicone oil/siloxane[3] |  | 97.6/2.4 | 99.2/0.8 | 97.6/2.4 | 97.6/2.4 | 97.6/2.4 |
|  | $SiR^2$/SiH[4] |  | 1/3 | 1/1 | 1/3 | 1/3 | 1/3 |
| Viscosity (mPa · s)(25° C.) |  |  | 3900 | 4000 | 2500 | 3700 | 15000 |
| Amount of hydrogen generated (mL) |  |  | 0 | 0 | 0 | 0 | 50 |
| Completely cured product | Light-transmitting property (light transmittance, %) |  | 99.0 | 98.4 | 99.0 | 98.8 | 99.0 |
|  | Heat resistance (residual ratio, %) |  | 98.5 | 98.6 | 98.5 | 98.4 | 98.9 |
| Optical-semiconductor device | Encapsulated state |  | A | A | A | A | A |
|  | Light resistance (retention of luminance, %) |  | ≥99% | ≥99% | ≥99% | ≥99% | ≥99% |

[1] Content of the condensation catalyst (mol) per 100 mol of the dual-end silanol type silicone oil.
[2] Molar ratio of SiOH groups of the dual-end silanol type silicone oil to SiX groups of the alkenyl-containing silicon compound (SiOH/SiX).
[3] Weight ratio of the dual-end silanol type silicone oil to the organohydrogensiloxane (dual-end silanol type silicone oil/organohydrogensiloxane).
[4] Ratio of the content of $SiR^2$ group of the alkenyl-containing silicon compound to the content of SiH groups of the organohydrogensiloxane ($SiR^2$/SiH).

The results show that the compositions of the Examples can be prepared without suffering an increase in viscosity, as compared with the composition of the Comparative Example, and without generating hydrogen gas, and can provide resin compositions having excellent light-transmitting properties and heat resistance. This suggests that tin complex compounds (tin catalysts), as compared with conventional condensation catalysts (e.g., tetramethylammonium hydroxide), can inhibit organohydrogensiloxanes from hydrolyzing and that compositions containing the tin catalysts have satisfactory handling property.

While the invention has been described in detail with reference to specific embodiments thereof, it will be apparent to one skilled in the art that various changes and modifications can be made therein without departing from the spirit and scope thereof.

Incidentally, the present application is based on Japanese Patent Application No. 2010-044277 filed on Mar. 1, 2010, and the contents are incorporated herein by reference.

All references cited herein are incorporated by reference herein in their entirety.

Also, all the references cited herein are incorporated as a whole.

The composition for thermosetting silicone resin of the invention is suitable for use in, for example, producing semiconductor elements for the backlight of a liquid-crystal screen and for traffic signals, outdoor large-sized displays, advertising signs, and the like.

What is claimed is:

1. A composition for a thermosetting silicone resin comprising:

(1) a dual-end silanol type silicone oil;

(2) an alkenyl-containing silicon compound;

(3) an organohydrogensiloxane;

(4) a condensation catalyst; and (5) a hydrosilylation catalyst, wherein the (3) organohydrogensiloxane comprises at least one kind selected from the group consisting of compounds represented by formula (III):

(III)

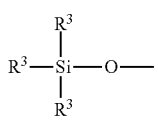

A

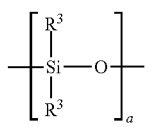

B

-continued

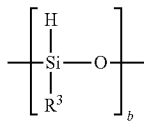

wherein A, B, and C indicate constitutional units, A representing an end unit and B and C representing repeating units, $R^3$ represents a monovalent hydrocarbon group, a is an integer of 0 or larger, and b is an integer of 2 or larger, provided that all $R^3$ groups are either the same or different, and compounds represented by formula (IV):

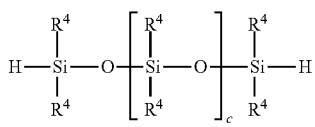

wherein $R^4$ represents a monovalent hydrocarbon group, and c represents an integer of 0 or larger, provided that all $R^4$ groups are either the same or different, and wherein the (4) condensation catalyst comprises a tin complex compound.

2. The composition according to claim 1, wherein the (1) dual-end silanol type silicone oil is a compound represented by formula (I):

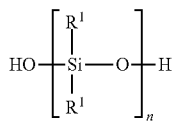

wherein $R^1$ represents a monovalent hydrocarbon group, and n is an integer of 1 or larger, provided that all $R^1$ groups are either the same or different.

3. The composition according to claim 1, wherein the (2) alkenyl-containing silicon compound is a compound represented by formula (II):

$$R^2\text{—}SiX_3 \quad (II)$$

wherein $R^2$ represents an organic group having a framework containing an alkenyl group, and X represents a halogen atom, an alkoxy group, or an acetoxy group, provided that the three Xs are either the same or different.

4. The composition according to claim 1, wherein the (4) condensation catalyst includes di-n-butyldiacetoxytin or bis(2-ethylhexanoate)tin as the tin complex compound.

5. A silicone resin sheet obtained by semi-curing the composition according to claim 1.

6. A silicone resin cured product obtained by curing the silicone resin sheet according to claim 5.

7. An optical-semiconductor device comprising an optical-semiconductor element encapsulated by the silicone resin sheet according to claim 5.

* * * * *